US007672136B2

(12) United States Patent
He et al.

(10) Patent No.: US 7,672,136 B2
(45) Date of Patent: Mar. 2, 2010

(54) HEAT SINK ASSEMBLY

(75) Inventors: Xiang-Yang He, Shenzhen (CN); Jing Zhang, Shenzhen (CN); Jian Liu, Shenzhen (CN); Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/206,739

(22) Filed: Sep. 9, 2008

(65) Prior Publication Data

US 2009/0323289 A1    Dec. 31, 2009

(30) Foreign Application Priority Data

Jun. 27, 2008  (CN) .................... 2008 1 0068059

(51) Int. Cl.
*H05K 7/20* (2006.01)
(52) U.S. Cl. .................. 361/719; 361/704; 24/457; 24/458; 165/80.3; 257/718; 257/719
(58) Field of Classification Search ............ 361/704, 361/719; 165/80.3; 257/718, 719; 174/16.1, 174/16.3; 24/457, 458
See application file for complete search history.

(56) References Cited

U.S. PATENT DOCUMENTS

| | | | | |
|---|---|---|---|---|
| 5,615,735 A | * | 4/1997 | Yoshida et al. ............. | 165/80.3 |
| 5,734,556 A | * | 3/1998 | Saneinejad et al. ........... | 361/719 |
| 6,392,886 B1 | * | 5/2002 | Lee et al. .................... | 361/703 |
| 6,424,530 B1 | * | 7/2002 | Lee et al. .................... | 361/704 |
| 6,496,371 B2 | * | 12/2002 | Winkel et al. ............... | 361/703 |
| 6,518,507 B1 | * | 2/2003 | Chen ......................... | 174/252 |
| 6,644,387 B1 | * | 11/2003 | Lee et al. ................... | 165/80.3 |
| 7,167,369 B1 | * | 1/2007 | Huynh et al. ............... | 361/719 |
| 7,203,066 B2 | * | 4/2007 | Lee et al. .................... | 361/704 |
| 7,382,622 B2 | * | 6/2008 | Li et al. ....................... | 361/719 |
| 7,518,874 B2 | * | 4/2009 | Deng et al. ................. | 361/710 |
| 7,567,435 B2 | * | 7/2009 | Azar et al. ............. | 361/679.54 |
| 2009/0237885 A1 | * | 9/2009 | Wang et al. ................. | 361/704 |

* cited by examiner

*Primary Examiner*—Boris L Chervinsky
(74) *Attorney, Agent, or Firm*—Frank R. Niranjan

(57) ABSTRACT

An electronic assembly includes a printed circuit board mounted with an electronic component, a heat sink, and a clip securing the heat sink on the printed circuit board to enable the heat sink to have an intimate contact with the electronic component. The printed circuit board forms two engaging portions each defining a receiving hole therein. The heat sink includes a base and a plurality of fins. The clip includes a pressing member pressing the heat sink to the electronic component, two V-shaped operating members extending slantwise from ends of the pressing member, and two clasps extending outwardly from ends of the operating members. Height of each of the clasps is larger than that of each of the receiving holes of the engaging portions. The clasps of the clip lock with the engaging portions by manipulating the operating members.

13 Claims, 3 Drawing Sheets

HEAT SINK ASSEMBLY

BACKGROUND OF THE INVENTION

1. Field of the Invention

The present invention relates to a heat sink assembly, and more particularly to a heat sink assembly having a wire clip and a heat sink, wherein the wire clip can firmly secure the heat sink to a printed circuit board on which a heat generating electronic component is mounted.

2. Description of Related Art

It is widely acknowledged that heat is produced during operations of electronic components such as central processing units (CPUs). The produced heat must be quickly removed to ensure the electronic components working normally. Typically, a heat sink is disposed on the electronic components mounted on the printed circuit board to dissipate heat therefrom.

Typically, wire clips are widely used for securing heat sinks on the printed circuit board. A wire clip, which is integrally made of a resilient metal wire, generally includes an elongated pressing portion and a pair of locking clasps extending downwardly from opposite ends of the pressing portion. The printed circuit board forms a pair of engaging portions. Each engaging portion defines a receiving hole to receive a corresponding locking clasp therein. When assembled, the pressing portion of the clip is located between fins of the heat sink, and the locking clasps are pressed inwardly and downwardly until the locking clasps are in level with the receiving holes of the engaging portions. The locking clasps are moved towards the receiving holes of the engaging portions and finally clasp the engaging portions. Thus, the heat sink is secured on the printed circuit board.

When a height of each of the locking clasps is smaller than that of the receiving hole of the engaging portion, the locking claps can easily enter the holes to lock with the engaging portions. However, for such a locking, the locking clasps of the clip are prone to disengage from the engaging portions when the heat sink is subject to a vibration or a shock. When a height of each of the locking clasps is larger than that of the receiving hole of the engaging portion, the locking clasps of the clip can not easily extend through the receiving holes to engage with the engaging portions.

What is needed, therefore, is a heat sink assembly having a heat sink and a clip, wherein the clip can be easily manipulated to firmly secure the heat sink to a printed circuit board.

SUMMARY OF THE INVENTION

An electronic assembly includes a printed circuit board with an electronic component, a heat sink located on the electronic component, and a clip securing the heat sink on the printed circuit board. The printed circuit board forms two engaging portions. Each engaging portion defines a receiving hole therein. The heat sink includes a base and a plurality of fins extending from the base. The clip includes a pressing member sandwiched between the fins of the heat sink and pressing the heat sink toward the electronic component, two operating members extending slantwise from ends of the pressing member, and two clasps extending outwardly from ends of the operating members. Heights of the clasps are larger than those of the receiving holes of the engaging portions. The clasps of the clip lock with the engaging portions by operating the operating members, each of which has a V-shaped configuration extending outwardly and downwardly in respect to the heat sink.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
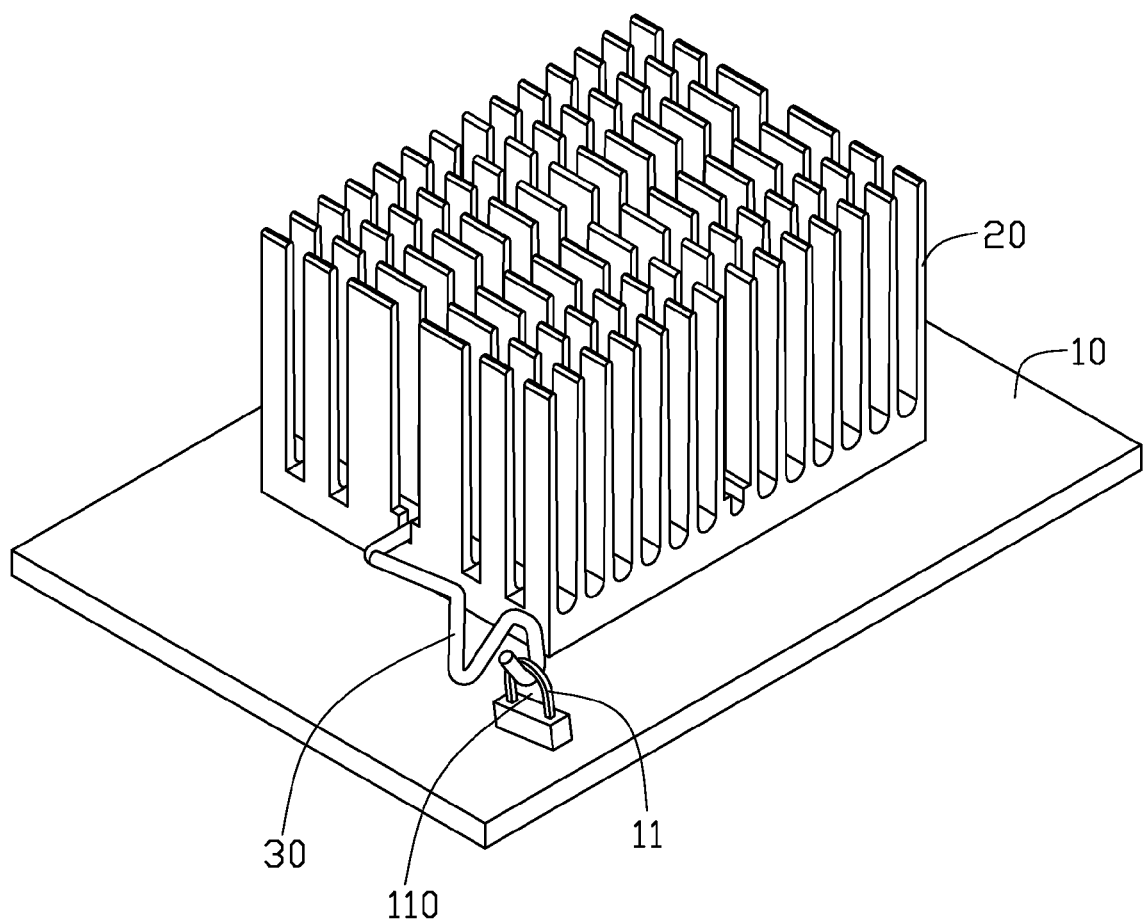
FIG. 1 is an assembled view of a heat sink assembly in accordance with a preferred embodiment of the present invention.
Figure 2:
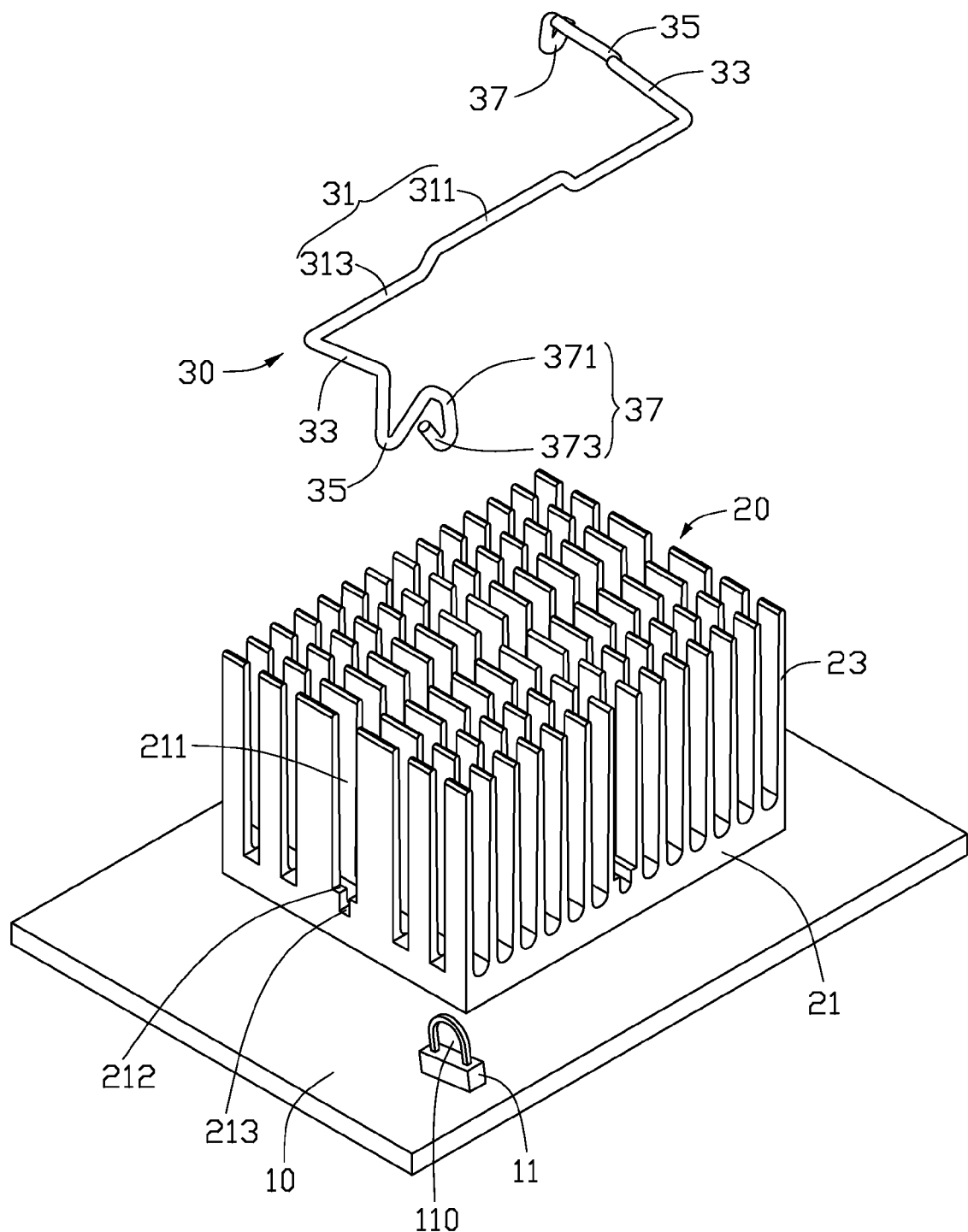
FIG. 2 is an exploded view of the heat sink assembly of FIG. 1.
Figure 3:
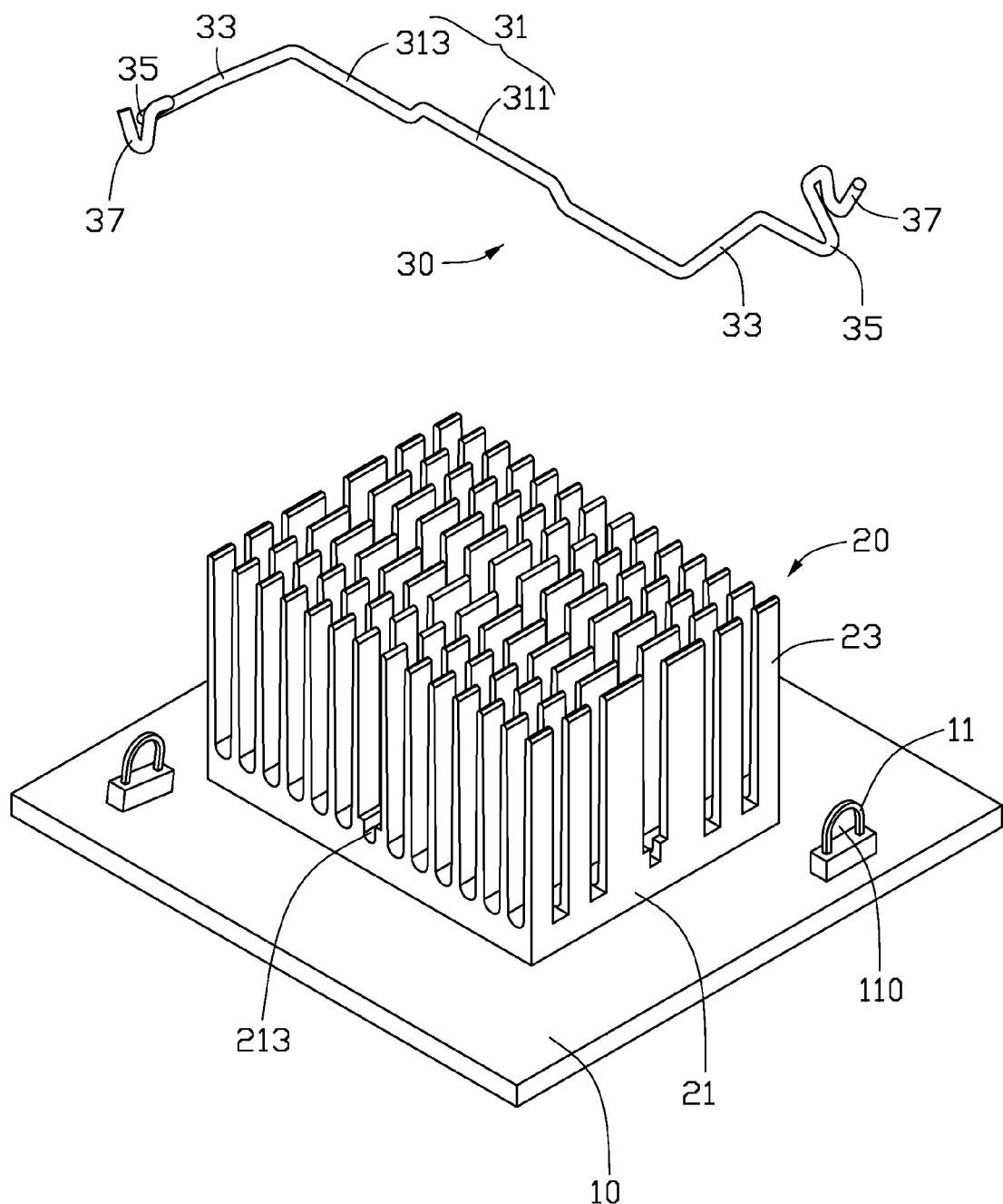
FIG. 3 is an exploded view of the heat sink assembly of FIG. 1, but shown from another aspect.

Referring to FIGS. 1-3, a heat sink assembly is used to dissipate heat generated by electronic components (not shown) mounted on a printed circuit board 10. The heat sink assembly comprises a heat sink 20 and a wire clip 30 securing the heat sink 20 on the printed circuit board 10. The printed circuit board 10 forms a pair of engaging portions 11 located near diagonally opposite corners of the heat sink 20. Each engaging portion 11 defines a receiving hole 110 to receive the clip 30.

The heat sink 20 is made of copper or aluminum. The heat sink 20 comprises a rectangular base 21 and a plurality of fins 23 extending upwardly from a top surface of the base 21. The fins 23 are spaced from and parallel to each other. A channel 211 is defined between every two adjacent fin rows formed by the fins 21. A pair of protruded portions 212 extend upwardly from bottom portions of each pair of adjacent fins 21 of a middle channel 211, respectively. The protruded portions 212 are spaced from each other; thus, a straight groove 213 is defined between the protruded portions 212 to receive the clip 30 therein.

The clip 30 is made of a single spring wire. The clip 30 comprises an elongated pressing member 31, a pair of straight connecting members 33 extending outwardly from opposite ends of the pressing member 31 and oriented towards opposite directions, two operating members 35 extending slantwise and downwardly from ends of the connecting members 33, respectively, and two clasps 37 extending outwardly from ends of the operating members 35, respectively. The pressing member 31 comprises a straight pressing portion 311 and a pair of straight extending portions 313 extending from opposite lower ends of the pressing portion 311 and offsetting from the pressing portion 311. The extending portions 313 are parallel to the pressing portion 311. The clip 30 is symmetrical about a central point (not labeled) of the pressing portion 311 of the pressing member 31. The connecting members 33 are perpendicular to the extending portions 313 of the pressing portion 31. The operating member 35 has a V-shaped configuration and extends slantwise and downwardly from an end of a corresponding connecting member 33. The clasp 37 has a U-shaped configuration and comprises a first locking portion 371 extending downwardly and outwardly from an end of the operating member 35 and a second locking portion 373 extending upwardly and outwardly from an end of the first locking portion 371. Heights of the first and second locking portions 371, 373 are equal to each other and each are larger than a height of the receiving hole 110 of the engaging portion 11, when the operating members 35 are not manipulated to be rotated relative to the connecting members 33.

In assembly, the heat sink 20 is disposed on the printed circuit board 10 to contact with the electronic component on the printed circuit board 10. The clip 30 is inserted in the groove 213 of the heat sink 20. In this state, the pressing portion 311 of the pressing member 31 presses top surfaces of the protruded portions 212 and the extending portions 313 press the top surface of the base 21 and is sandwiched between the protruded portions 212 of the heat sink 20. An outer part of each of the extending portions 313 of the pressing member 31 is located outside the heat sink 20. The operating members 35 are located above and spaced a distance from the printed circuit board 10. The clasps 37 are located over the engaging portions 11. The operating members 35 are then manipulated by a user to be pressed inwardly; thus, the clasps 37 are moved to be located at a position between the heat sinks 20 and the engaging portions 11. Then, the operating members 35 are pressed downwardly until the clasps 37 are in level with the receiving holes 110 of the engaging portions 11. Then, the operating members 35 are rotated inwardly relative to the connecting members 33 until the heights of the second locking portions 373 of the clasps 37 are smaller than those of the receiving holes 110 of the engaging portions 11. Then, the operating members 35 are moved outwardly towards the receiving holes 110 of the engaging portions 11 until the second locking portions 373 of the clasps 37 extend through the receiving holes 110. Finally, the operating members 35 are released from the depressing and rotating forces; thus, the clasps 37 spring up and clasp with the engaging portions 11. Therefore, the heat sink 20 is securely mounted on the printed circuit board 10. At this state, heights of the first and second locking portions 371, 373 of the clasps 37 are larger than those of the receiving holes 110 of the engaging portions 11; thus, the clasps 37 securely engage with the engaging portions 11.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An electronic assembly comprising:
   a printed circuit board adapted for mounting an electronic component thereon, two engaging portions formed at the printed circuit board, each engaging portion defining a receiving hole therein; and
   a heat sink adapted to be located on the electronic component to have a thermal connection therewith, the heat sink comprising a base and a plurality of fins spaced from each other and extending upwardly from the base; and
   a clip resiliently clamping the heat sink on the printed circuit board, the clip comprising a pressing member sandwiched between the fins of the heat sink, a pair of connecting members extending outwardly from opposite ends of the pressing member and oriented towards opposite directions, two operating members extending slantwise and downwardly from ends of the connecting members, respectively, and two clasps extending outwardly from ends of the operating members, respectively;
   wherein a height of each of the clasps is larger than that of each of the receiving holes of the engaging portions, and the clasps are moved to lock with the engaging portions by operating the operating members.

2. The electronic assembly as claimed in claim 1, wherein each of the clasps comprises a first locking portion extending downwardly and outwardly from an end of a corresponding operating member and a second locking portion extending upwardly and outwardly from an end of the first locking portion, and heights of the first and second locking portions are larger than that of the receiving hole of a corresponding engaging portion.

3. The electronic assembly as claimed in claim 2, wherein each clasp has a U-shaped configuration, and the heights of the first and second locking portions of each clasp are equal to each other.

4. The electronic assembly as claimed in claim 1, wherein each of the operating members has a V-shaped configuration and is located over and spaced from the printed circuit board.

5. The electronic assembly as claimed in claim 1, wherein the pressing member comprises a pressing portion and a pair of extending portions extending from opposite ends of the pressing portion, the pressing portion abutting against the fins of the heat sink and the extending portions connecting with the connecting members and abutting against the base of the heat sink.

6. The electronic assembly as claimed in claim 5, wherein the pressing portion and the extending portions of the pressing member each are straight and the extending portions are parallel to the pressing portion and located below the pressing portion.

7. The electronic assembly as claimed in claim 6, wherein the clip is symmetrical about a central point of the pressing portion of the pressing member.

8. The electronic assembly as claimed in claim 1, wherein a pair of protruded portions extend upwardly from bottom portions each pair of adjacent fins, and the pressing member of the clip is sandwiched between the protruded portions and abuts against the protruded portions.

9. A clip assembly assembling a first member and a second member together, the clip assembly comprising:
   a clip comprising a pressing portion positioned in the first member, two clasps extending beyond two ends of the first member and being located on the second member, and a V-shaped operating portion located between the pressing portion and a corresponding clasp; and
   two engaging portions formed from the second member, each of the engaging portions defining an engaging hole having one of the clasps engaging therein;
   wherein each of the clasps comprises a locking portion extending through the engaging hole of a corresponding engaging portion, and the locking portion has a height larger than that of the engaging hole, and wherein the V-shaped operating portion is depressed and rotated to enable the locking portion to be inserted into the engaging hole.

10. The clip assembly as claimed in claim 9, wherein each of the clasps of the clip comprises another locking portion, the engaging portion is sandwiched between the locking portion and the another locking portion.

11. The clip assembly as claimed in claim 9, wherein the clip comprises an extending portion extending from an end of the pressing portion, the extending portion offsetting from the pressing portion.

12. The clip assembly as claimed in claim 11, wherein the extending portion of the clip is parallel to the pressing portion.

13. The clip assembly as claimed in claim 1, wherein the clip comprises a connecting portion connecting the extending portion and the operating portion, the connecting portion being perpendicular to the extending portion.

* * * * *